United States Patent
Kang et al.

(10) Patent No.: US 10,152,171 B2
(45) Date of Patent: Dec. 11, 2018

(54) TOUCH PANEL INCLUDING TOUCH SENSING ELECTRODES WITH REDUCED VISIBILITY

(71) Applicant: Samsung Display Co., Ltd., Yongin-si (KR)

(72) Inventors: Ki Nyeng Kang, Seoul (KR); Sun Haeng Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 145 days.

(21) Appl. No.: 15/210,891

(22) Filed: Jul. 15, 2016

(65) Prior Publication Data
US 2017/0153744 A1  Jun. 1, 2017

(30) Foreign Application Priority Data
Nov. 30, 2015 (KR) .................. 10-2015-0169360

(51) Int. Cl.
*G06F 3/041* (2006.01)
*G06F 3/044* (2006.01)
*H03K 17/96* (2006.01)

(52) U.S. Cl.
CPC ............ *G06F 3/0416* (2013.01); *G06F 3/044* (2013.01); *G06F 2203/04102* (2013.01); *G06F 2203/04112* (2013.01); *H03K 2017/9602* (2013.01)

(58) Field of Classification Search
CPC ........... G06F 3/044; G06F 2203/04112; G06F 3/0416; G06F 2203/04102; H03K 17/96–17/9622
See application file for complete search history.

(56) References Cited

U.S. PATENT DOCUMENTS

| 2012/0019457 | A1* | 1/2012 | Cho ................. G06F 3/044 345/173 |
|---|---|---|---|
| 2012/0062487 | A1 | 3/2012 | Lee et al. |
| 2013/0153391 | A1 | 6/2013 | Liu et al. |
| 2013/0328830 | A1 | 12/2013 | Han et al. |
| 2014/0028584 | A1 | 1/2014 | Park et al. |
| 2015/0277655 | A1 | 10/2015 | Kim |

FOREIGN PATENT DOCUMENTS

| KR | 10-2012-0059664 | 6/2012 |
|---|---|---|
| KR | 10-2014-0046888 | 4/2014 |

OTHER PUBLICATIONS

Extended European Search Report dated May 4, 2017, in European Patent Application No. 16188473.9.

* cited by examiner

*Primary Examiner* — Laurence J Lee
(74) *Attorney, Agent, or Firm* — H.C. Park & Associates, PLC

(57) ABSTRACT

A touch panel includes: first touch patterns disposed on a substrate, the first touch patterns being spaced apart from and electrically connected to one another; and second touch patterns partially overlapping the first touch patterns, the second touch patterns being spaced apart from and electrically connected to one another. A first touch pattern of the first touch patterns is disposed adjacent to different first touch patterns of the first touch patterns in at least two different directions.

20 Claims, 7 Drawing Sheets

TOUCH PANEL INCLUDING TOUCH SENSING ELECTRODES WITH REDUCED VISIBILITY

CROSS-REFERENCE TO RELATED APPLICATION

This application claims priority from and the benefit of Korean Patent Application No. 10-2015-0169360, filed on Nov. 30, 2015, which is hereby incorporated by reference for all purposes as if fully set forth herein.

BACKGROUND

Field

Exemplary embodiments relate to interaction detection, and, more particularly, to a touch panel configured to detect touch interactions.

Discussion of the Background

A touch panel is a device that senses a touch interaction (e.g., an actual touch or near touch) by, for instance, a pen, stylus, user appendage, etc. To this end, touch panels may be disposed on a display panel, such as a liquid crystal display, an electrophoretic display, an electrowetting display, an organic light-emitting diode display, an inorganic electroluminescent display, a field emission display, a surface-conduction electron-emitter display, a plasma display, and a cathode ray tube display, and the like. In this manner, a touch panel may be used to input a signal to the display device or an electronic device associated with the display device. Conventional touch panels typically include a substrate and a touch sensor unit disposed on the substrate to recognize a touch interaction. The touch sensor unit may detect a touch by sensing a variation in, for instance, capacitance generated between a first signal line and a second signal line crossing the first signal line.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a touch panel to prevent (or at least reduce) recognition (e.g., visibility) of a touch sensor by an observer. One or more exemplary embodiments provide a touch panel with improved flexibility. One or more exemplary embodiments provide a touch panel to minimize (or at least reduce) damage caused by stress, such as bending stress.

Additional aspects will be set forth in the detailed description which follows, and, in part, will be apparent from the disclosure, or may be learned by practice of the inventive concept.

According to one or more exemplary embodiments, a touch panel includes: first touch patterns disposed on a substrate, the first touch patterns being spaced apart from and electrically connected to one another; and second touch patterns partially overlapping the first touch patterns, the second touch patterns being spaced apart from and electrically connected to one another. A first touch pattern of the first touch patterns is disposed adjacent to different first touch patterns of the first touch patterns in at least two different directions.

According to one or more exemplary embodiments, a touch panel includes: a first signal line extending in a first direction on a substrate, and a second signal line extending in a second direction on the substrate. The first signal line includes a first touch electrode; a second touch electrode; and a first connection part electrically connecting the first touch electrode and the second touch electrode to one another. The second signal line includes a third touch electrode; a fourth touch electrode; and a second connection part electrically connecting the third touch electrode and the fourth touch electrode to one another. Each of the first touch electrode, the second touch electrode, the third touch electrode, and the fourth touch electrode respectively includes: first touch patterns spaced apart from one another; and second touch patterns spaced apart from one another and at least partially overlapping with corresponding first touch patterns of the first touch patterns. The first touch patterns are electrically connected to the second touch patterns.

According to one or more exemplary embodiments, a touch panel includes: a first signal line extending in a first direction on a substrate, and a second signal line extending in a second direction on the substrate. The first signal line includes: first touch electrodes; and a first connection part electrically connecting the first touch electrodes to one another. The second signal line includes: second touch electrodes; and a second connection part electrically connecting the second touch electrodes to one another. Each of the first touch electrodes and the second touch electrodes respectively includes: first touch patterns separated from each other; a connection pattern connecting the first touch patterns to one another; and second touch patterns completely overlapping with a corresponding first touch pattern of the first touch patterns. The first touch patterns are electrically connected to the second touch patterns.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
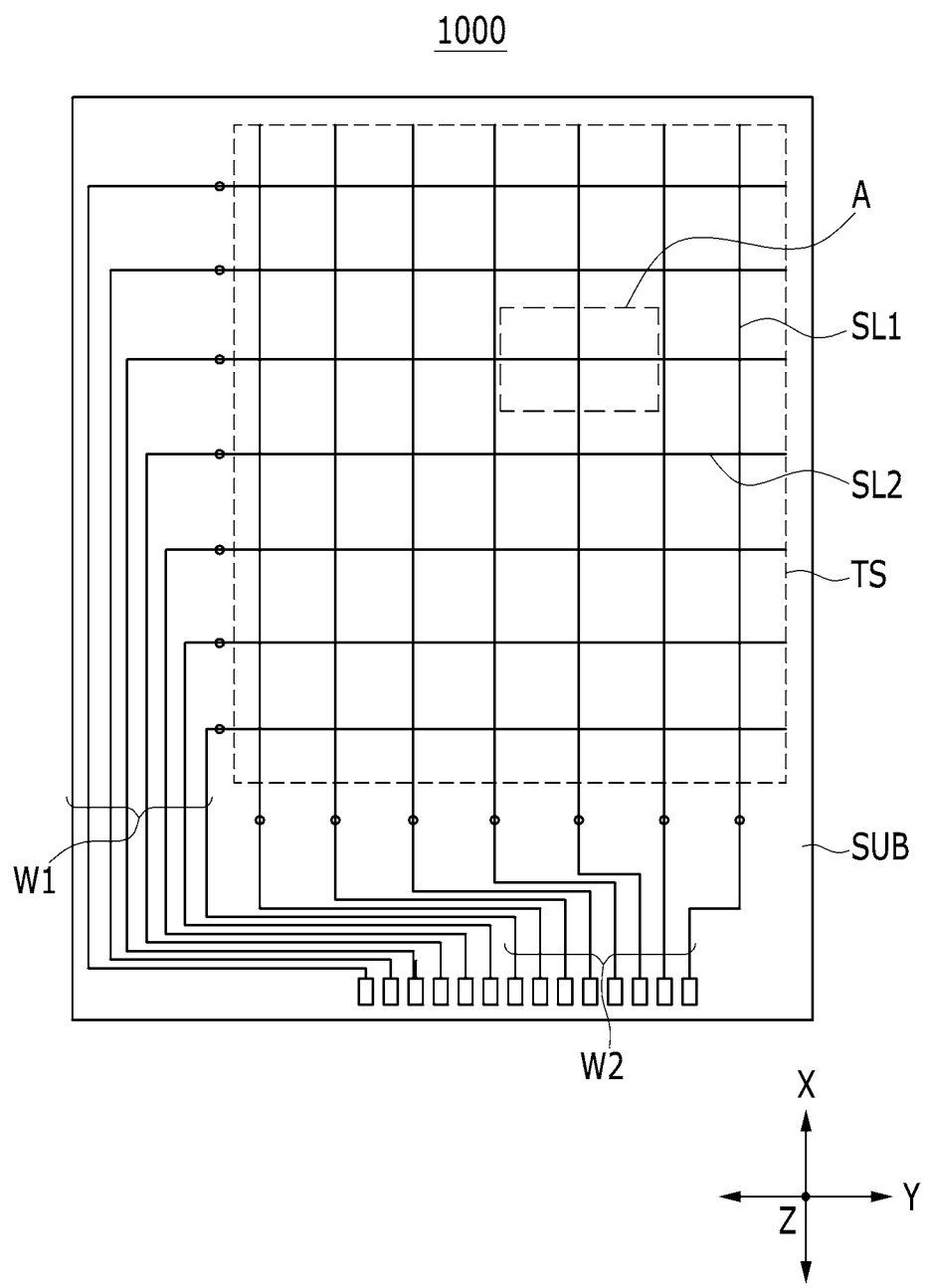
FIG. 1 is a schematic block diagram of a touch panel, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic block diagram of a touch panel, according to one or more exemplary embodiments.

As shown in FIG. 1, the touch panel 1000 may include a substrate SUB, a first wiring part W1, a second wiring part W2, and a touch sensor portion TS. The touch panel may further include a touch controller (not illustrated), and the touch controller may be formed as a flexible printed circuit board (FPCB), a printed circuit board (PCB), etc., that is electrically coupled to the first and second wiring parts W1 and W2. For example, the touch controller may be electrically coupled to the first and second wiring parts W1 and W2 via the pads PAD, which are disposed on the substrate SUB. The touch controller may calculate (or otherwise determine) information about where a user interacts (e.g., touches) the touch panel 1000 by digitizing an analog electrical signal transmitted from the touch panel 1000 as a digital signal using a converter or the like. The controller may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

The substrate SUB may be flexible, and may include an organic material, an inorganic material, glass, or a metal, such as stainless steel (SUS). The substrate SUB may have a plate shape, a film shape, or any other suitable configuration. Since the substrate SUB is flexible, the entire touch panel 1000 may be flexible.

The first and second wiring parts W1 and W2 are disposed in a peripheral region of the substrate SUB, and are connected to the touch sensor portion TS. The first and second wiring parts W1 and W2 may couple the touch sensor portion TS to the touch controller, and may include an opaque conductive material, such as a metal or the like, or a transparent conductive material. The first and second wiring parts W1 and W2 may be formed on the substrate SUB using the same process as, or a different process from, the process utilized to form the touch sensor portion TS.

The touch sensor portion TS is disposed in an active region of the substrate SUB where a touch interaction may be directly detected. According to one or more exemplary embodiments, the entire touch sensor portion TS is formed of transparent materials, and is, thereby, transparent (or at least translucent). The touch sensor portion TS may be formed as a capacitive type. The touch sensor portion TS may include, on the substrate SUB, a first signal line SL1 extending in a first direction (e.g., an X-axis direction) to be connected to the second wiring part W2, and a second signal line SL2 extending in a second direction (e.g., a Y-axis direction) crossing the first direction to be connected to the first wiring part W1.

According to one or more exemplary embodiments, a plurality of first signal lines SL1 may be respectively and sequentially arranged in the second direction and extend parallel (or substantially parallel) to one another in the first direction, as shown in FIG. 1, but exemplary embodiments are not limited thereto. For instance, the first signal lines SL1 may be bent at least once in the second direction and longitudinally extend in the first direction. A plurality of second signal lines SL2 may be respectively and sequentially arranged in the first direction and extend parallel (or substantially parallel) to one another in the second direction, as shown in FIG. 1, but exemplary embodiments are not limited thereto. For instance, the plurality of second signal lines SL2 may be bent at least once in the first direction and longitudinally extend in the second direction. The first signal lines SL1 and the second signal lines SL2 cross each other, but are insulated from each other. It is noted, however, that the first signal lines SL1 and the second signal lines SL2 may be disposed on the same layer over the substrate SUB as one another.

When voltages are applied to the plurality of first signal lines SL1 and/or the plurality of second signal lines SL2, capacitance may be generated between each of the first signal lines SL1 and each of the second signal lines SL2. In this manner, when the touch sensor portion TS detects a touch interaction, capacitance changes at a position where the touch interaction is detected may cause the voltage applied to the first signal line SL1 or second signal line SL2 to vary. Based on the variance of the voltages, the touch sensor portion TS (in conjunction with the touch controller) of the touch panel 100 may detect where on the touch panel 100 the touch interaction has occurred (or is occurring).

Figure 2:
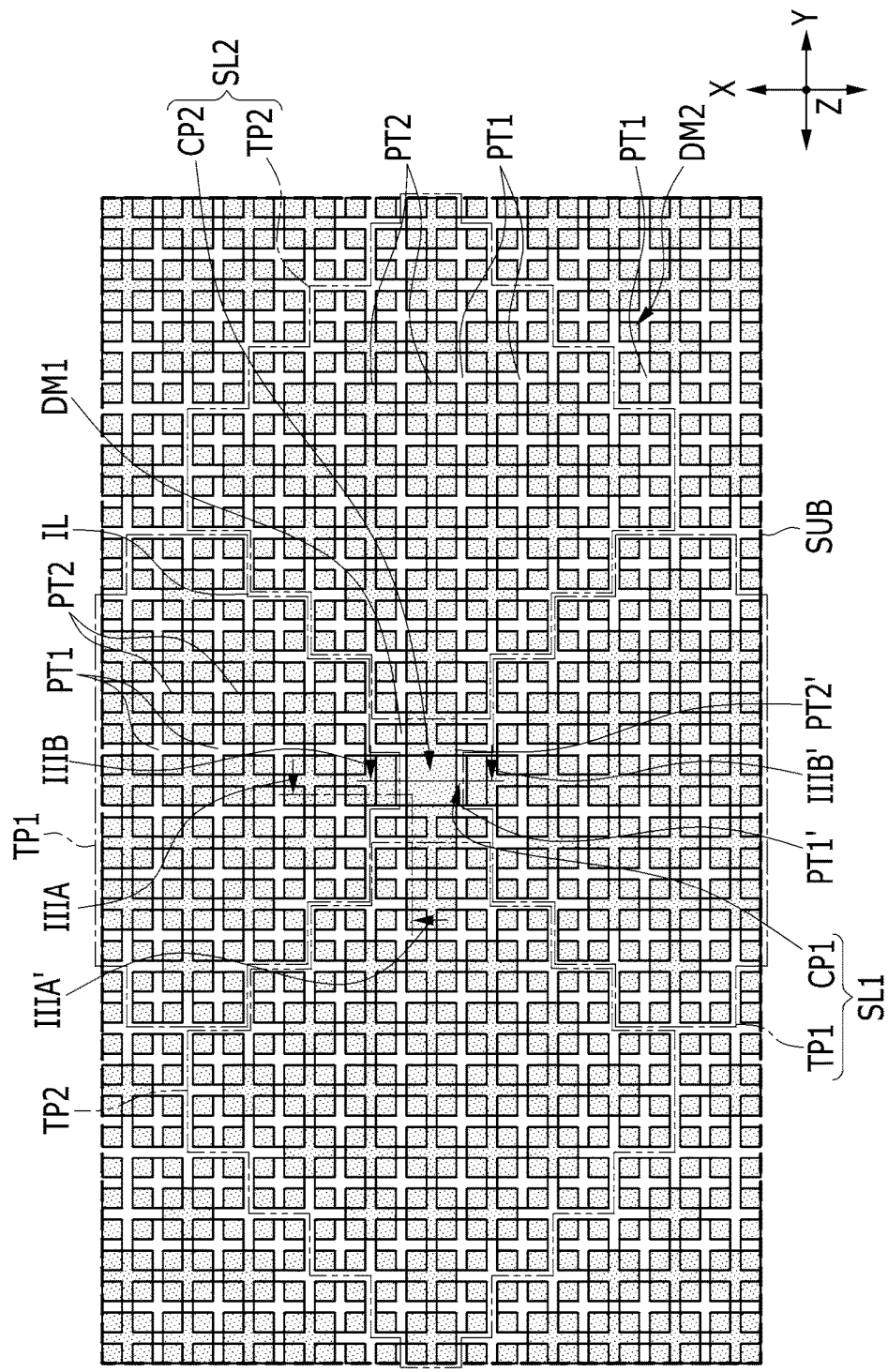
FIG. 2 is an enlarged plan view of portion "A" of the touch panel of FIG. 1, according to one or more exemplary embodiments.
Figure 3A:
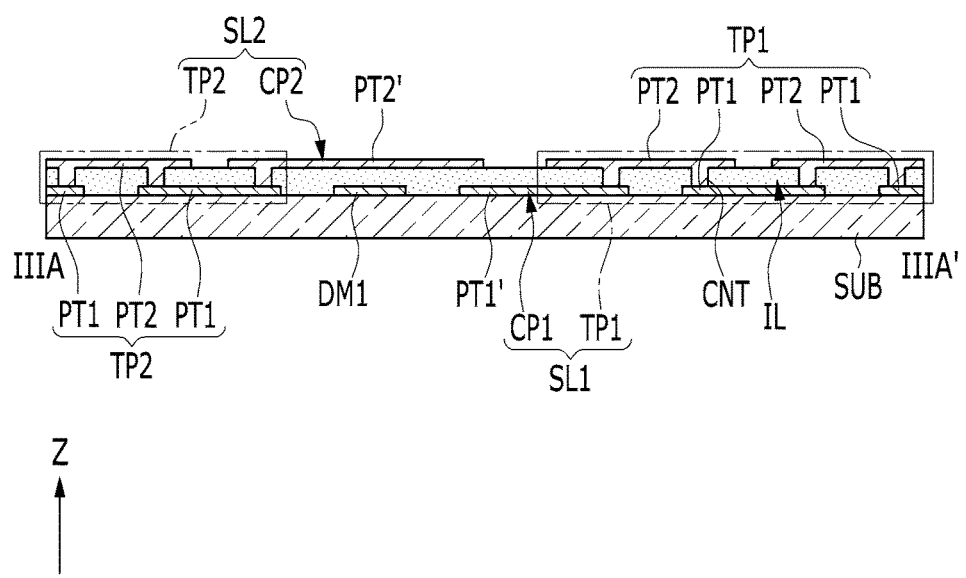
FIG. 3A is a cross-sectional view of the touch panel of FIG. 1 taken along sectional line IIIA-IIIA' of FIG. 2, according to one or more exemplary embodiments.
Figure 3B:
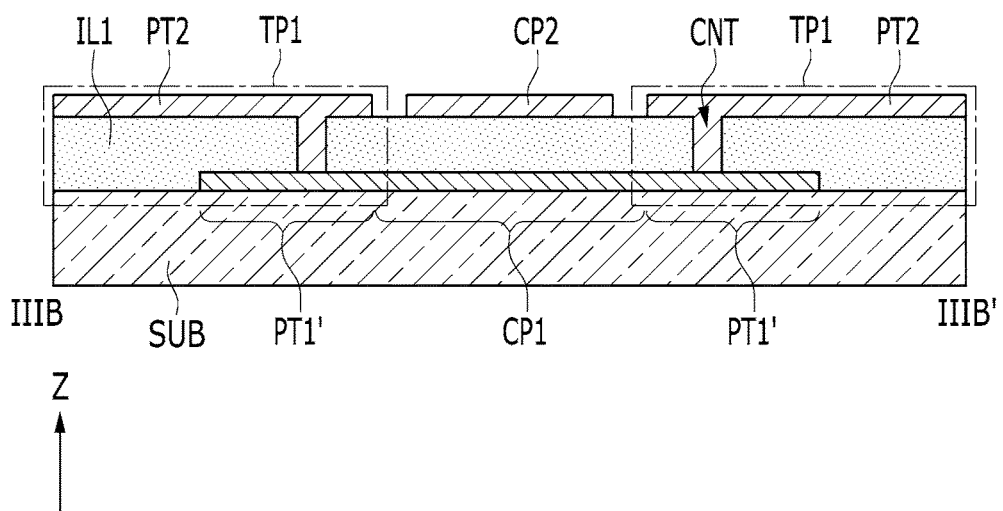
FIG. 3B is a cross-sectional view of the touch panel of FIG. 1 taken along sectional line IIIB-IIIB' of FIG. 2, according to one or more exemplary embodiments.

FIG. 2 illustrates an enlarged plan view of portion "A" of the touch panel of FIG. 1, according to one or more exemplary embodiments. FIG. 3A is a cross-sectional view of the touch panel of FIG. 1 taken along sectional line IIIA-IIIA' of FIG. 2, according to one or more exemplary embodiments. FIG. 3B is a cross-sectional view of the touch panel of FIG. 1 taken along sectional line of IIIB-IIIB' FIG. 2, according to one or more exemplary embodiments.

Referring to FIGS. 2, 3A, and 3B, the touch sensor portion TS of the touch panel 1000 may include the first signal line SL1, an insulating layer IL, the second signal line SL2, and first and second dummy parts DM1 and DM2.

The first signal line SL1 extends on the substrate SUB in the first direction X, and includes a first touch electrode TP1 and a first connection part CP1. A plurality of first touch electrodes TP1 may extend in the first direction X and may be separated from each other in the second direction Y. The first touch electrode TP1 may include a plurality of first touch patterns PT1 and a plurality of second touch patterns PT2. The plurality of first touch patterns PT1 are disposed on the substrate SUB and are separated from each other. As seen in FIGS. 2, 3A, and 3B, the plurality of first touch patterns PT1 are disposed in a matrix formation in a plan view and are separated from each other; however, exemplary embodiments are not limited thereto. For instance, the plurality of first touch patterns PT1 may be separated from each other in any suitable formational shape, such as an irregular shape. The plurality of first touch patterns PT1 may have the same surface area or different surface areas from one another when viewed in a plan view.

According to one or more exemplary embodiments, one first touch pattern PT1 among the plurality of first touch patterns PT1 is adjacent to a different first touch pattern PT1 in at least two different directions. The plurality of first touch patterns PT1 are separated from each other and are electrically coupled to one another through the second touch patterns PT2 corresponding to the plurality of first touch patterns PT1. A distance of 5 μm to 30 μm may be formed between adjacent first touch patterns PT1; however, exemplary embodiments are not limited thereto. Also, the first touch patterns PT1 may have a width of 25 μm to 100 μm; however, exemplary embodiments are is not limited thereto.

As seen in FIGS. 2, 3A, and 3B, the first touch pattern PT1 has a quadrangle shape in a plan view; however, the shape is not limited thereto. For instance, the first touch pattern PT1 may have a polygon shape, such as a triangle, a pentagon, a hexagon, a heptagon, an octagon, or a nonagon, or various shapes, such as a circle, an ellipse, or a closed-loop shape. The first touch pattern PT1 may include silver nanowire (AgNW). For example, the first touch pattern PT1 may include a resin layer made of resin and silver nanowire dispersed in the resin layer. It is also contemplated that, in one or more exemplary embodiments, the first touch pattern PT1 may include a metal mesh or a transparent conductive material, such as aluminum zinc oxide (AZO), gallium zinc oxide (GZO), indium tin oxide (ITO), indium zinc oxide (IZO), zinc oxide (ZnO), indium oxide ($In_2O_3$), etc. It is also contemplated that one or more conductive polymers (ICP) may be utilized, such as, for example, polyaniline, poly(3, 4-ethylenedioxythiophene) poly(styrenesulfonate) (PEDOT: PSS), etc.

A plurality of second touch patterns PT2 may be disposed on the plurality of first touch patterns PT1. To this end, the plurality of second touch patterns PT2 may be spaced apart from each other. The plurality of second touch patterns PT2 may be arranged in a matrix formation in a plan view; however, exemplary embodiments are not limited thereto. For instance, the plurality of second touch patterns PT2 may be separated from each other in various shapes, such as those disclosed in association with the plurality of first touch patterns PT1. The plurality of second touch patterns PT2 may respectively have the same surface area or different surface areas from one another in a plan view. The plurality of second touch patterns PT2 may have a distance therebetween of 2 μm to 15 μm; however, exemplary embodiments are not limited thereto. Also, the plurality of second touch patterns PT2 may have a width of 25 μm to 100 μm; however, exemplary embodiments are not limited thereto.

According to one or more exemplary embodiments, each of the plurality of second touch patterns PT2 may at least partially overlap with the plurality of first touch patterns PT1.

For instance, each of the plurality of second touch patterns PT2 may at least partially overlap with at least one first touch pattern PT1 among the plurality of first touch patterns PT1. In this manner, the plurality of second touch patterns PT2 may electrically connect a plurality of first touch patterns PT1 that are adjacent to one another in at least two different directions by overlapping with and being disposed on the plurality of first touch patterns PT1. As seen in FIGS. 2, 3A, and 3B, the plurality of second touch patterns PT2 have a quadrangle shape in a plan view; however, exemplary embodiments are not limited thereto. For instance, the plurality of second touch patterns PT2 may have a polygon shape, such as a triangle, a pentagon, a hexagon, a heptagon, an octagon, or a nonagon shape, or the various shapes, such as a circle, an ellipse, or a closed-loop shape.

More specifically, the second touch pattern PT2 is at least partially disposed on an adjacent first touch patterns PT1 among the plurality of first touch patterns PT1, and the second touch pattern PT2 is respectively electrically connected to the adjacent first touch patterns PT1 among the first touch patterns PT1. The second touch pattern PT2 may be electrically connected to the first touch pattern PT1 through a contact hole CNT formed in the insulating layer IL disposed between the first touch patterns PT1 and the second touch patterns PT2. Among the plurality of second touch patterns PT2, at least one second touch pattern PT2 may electrically connect at least three first touch patterns PT1. For example, as seen in FIG. 2, one second touch pattern PT2 may overlap an edge of four adjacent first touch patterns PT1, and the second touch pattern PT2 may electrically connect to each edge of the four adjacent first touch patterns PT1.

The second touch pattern PT2 may include a same or different material from that of the first touch pattern PT1. For instance, the second touch pattern PT2 may include a transparent conductive material, such as AZO, GZO, ITO, IZO, ZnO, $In_2O_3$, etc. It is also contemplated that one or more conductive polymers (ICP) may be utilized, such as, polyaniline, PEDOT:PSS, etc. It is also contemplated that, in one or more exemplary embodiments, the second touch pattern PT2 may include silver nanowire (AgNW), a metal mesh, etc.

As described above, the plurality of first touch patterns PT1 disposed in a matrix formation and separated from each other, and the plurality of second touch patterns PT2 disposed in the matrix formation and separated from each other are at least partially overlapped and electrically connected to form a first touch electrode TP1 having a predetermined region (or configuration). That is, as a plurality of second touch patterns PT2 respectively overlap respective portions of the first touch patterns PT1 between adjacent first touch patterns PT1 and form an electrical connection with the first touch patterns PT1 via the contact holes CNT, the plurality of first touch patterns PT1 and the plurality of second touch patterns PT2 may form a first touch electrode TP1. Further, as the plurality of second touch patterns PT2 are respectively positioned between the plurality of first touch patterns PT1 to connect adjacent first touch patterns PT1 together, the plurality of first touch patterns PT1 and the plurality of second touch patterns PT2 may form a first touch electrode TP1. As such, the plurality of first touch patterns PT1 and the plurality of second touch patterns PT2 may form one first touch electrode TP1 by electrically connecting each other.

As seen in FIGS. 2, 3A, and 3B, the first connection part CP1 electrically connects adjacent first touch electrodes TP1 via contact holes CNT. For instance, as seen in FIG. 3B, adjacent second touch patterns PT2 of adjacent first touch electrodes TP1 are disposed on and at least partially overlap with the first connection part CP1 via the contact holes CNT. In this manner, the first connection part CP1 enables the adjacent first touch electrodes TP1 to be electrically connected to one another. The second connection part CP2 overlaps with the first connection part CP1, and the insulating layer IL is disposed between the first connection part CP1 and the second connection part CP2.

When viewed in a plan view, the respective surface areas of the first connection parts CP1 may be greater than the respective surface areas of the first touch patterns PT1 and the second touch patterns PT2. It is contemplated, however, that, when viewed in a plan view, the respective surface areas of the first connection parts CP1 may be the same as the respective surface areas of the first touch patterns PT1 and the second touch patterns PT2. Further, the first connection part CP1 may have a rectangle shape; however, exemplary embodiments are not limited thereto. For instance, the first connection part CP1 may have one or more of the shapes described in association with the first and second touch patterns PT1 and PT2.

According to one or more exemplary embodiments, opposing sides of the first connection part CP1 may be integrally formed (or connected) with respective portions of whole or partially formed first touch patterns, such as partially formed first touch patterns PT1'. In this manner, the first signal line SL1 may include the first touch electrode TP1 including the plurality of first touch patterns PT1 and the plurality of second touch patterns PT2, and the first connection part CP1 electrically connecting adjacent first touch electrodes TP1.

The insulating layer IL covers a plurality of first touch patterns PT1 on the substrate SUB, and the plurality of second touch patterns PT2 are disposed on the insulating layer IL. The insulating layer IL has contact holes CNT formed therein, and the second touch patterns PT2 are electrically connected to the first touch patterns PT1 (or the first connection parts CP1) through the contact holes CNT. The insulating layer IL may include at least one of an inorganic material, e.g., silicon nitride, silicon oxide, etc., and an organic material.

The second signal line SL2 may be positioned in the same layer as the first signal line SL1, and the second signal line SL2 extends in the second direction Y crossing the first direction X. The second signal line SL2 includes the second touch electrode TP2 and the second connection part CP2. A plurality of the second touch electrodes TP2 may extend in the second direction Y and are separated from each other in the first direction X. The second touch electrode TP2 may include a plurality of first touch patterns PT1 and a plurality of second touch patterns PT2. The plurality of first touch patterns PT1 are disposed on the substrate SUB, and the plurality of first touch patterns PT1 are respectively separated from each other. The plurality of first touch patterns PT1 are arranged in the matrix shape formation when viewed in a plan view; however, exemplary embodiments are not limited thereto. For instance, the plurality of first touch patterns PT1 may be the separated from each other in various shape formations, such as one or more of the aforementioned formations. The plurality of first touch patterns PT1 respectively have the same surface area as each other or they may have different surface areas from each other when in viewed in a plan view.

According to one or more exemplary embodiments, the first touch patterns PT1 have a quadrangle shape when view in a plan view; however, exemplary embodiments are not limited thereto. For instance, the first touch patterns PT1 may have a polygon shape or various shape, such as the polygon shapes and various shapes previously described. The first touch pattern PT1 may include silver nanowire (AgNW). For example, the first touch pattern PT1 may include a resin layer made of resin and the silver nanowire dispersed in the resin layer. It is also contemplated that, in one or more exemplary embodiments, the first touch pattern PT1 may include a metal mesh or a transparent conductive material, such as AZO, GZO, ITO, IZO, ZnO, $In_2O_3$, etc. It is also contemplated that one or more conductive polymers (ICP) may be utilized, such as, for example, polyaniline, PEDOT:PSS, etc.

A plurality of second touch patterns PT2 may be disposed on the plurality of first touch patterns PT1. To this end, the plurality of second touch patterns PT2 may be spaced apart from each other. The plurality of second touch patterns PT2 may be arranged in a matrix formation in a plan view; however, exemplary embodiments are not limited thereto. The plurality of second touch patterns PT2 may be separated from each other in various shapes, such as those disclosed in association with the plurality of first touch patterns PT1. The plurality of second touch patterns PT2 may respectively have the same surface area or different surface areas from one another in a plan view.

According to one or more exemplary embodiments, each of the plurality of second touch patterns PT2 may at least partially may overlap each of the plurality of first touch patterns PT1. As seen in FIGS. 2, 3A, and 3B, the plurality of second touch patterns PT2 have a quadrangle shape in a plan view; however, exemplary embodiments are not limited thereto. For instance, the plurality of second touch patterns PT2 may have a polygon shape, such as a triangle, a pentagon, a hexagon, a heptagon, an octagon, or a nonagon shape, or the various shapes, such as a circle, an ellipse, or a closed-loop shape.

More specifically, the second touch pattern PT2 is at least partially disposed on an adjacent first touch patterns PT1 among the plurality of first touch patterns PT1, and the second touch pattern PT2 is respectively electrically connected to the adjacent first touch patterns PT1 among the first touch patterns PT1. The second touch pattern PT2 may be electrically connected to the first touch pattern PT1 through a contact hole CNT formed in the insulating layer IL disposed between the first touch patterns PT1 and the second touch patterns PT2. Among the plurality of second touch patterns PT2, at least one second touch pattern PT2 may electrically connect at least three first touch patterns PT1. For example, as seen in FIG. 2, one second touch pattern PT2 may overlap an edge of four adjacent first touch patterns PT1, and the second touch pattern PT2 may electrically connect to each edge of the four adjacent first touch patterns PT1.

The second touch pattern PT2 may include a same or different material from that of the first touch pattern PT1. For instance, the second touch pattern PT2 may include a transparent conductive material, such as AZO, GZO, ITO, IZO, ZnO, $In_2O_3$, etc. It is also contemplated that one or more conductive polymers (ICP) may be utilized, such as, polyaniline, PEDOT:PSS, etc. It is also contemplated that, in one or more exemplary embodiments, the second touch pattern PT2 may include silver nanowire (AgNW), a metal mesh, etc.

As described above, the plurality of first touch patterns PT1 disposed in a matrix formation and separated from each other, and the plurality of second touch patterns PT2 disposed in the matrix formation and separated from each other are at least partially overlapped and electrically connected to form a second touch electrode TP2 having a predetermined region (or configuration). That is, as a plurality of second touch patterns PT2 respectively overlap respective portions of the first touch patterns PT1 between adjacent first touch patterns PT1 and form an electrical connection with the first touch patterns PT1 via the contact holes CNT, the plurality of first touch patterns PT1 and the plurality of second touch patterns PT2 may form a second touch electrode TP2. Further, as the plurality of second touch patterns PT2 are respectively positioned between the plurality of first touch patterns PT1 to connect adjacent first touch patterns PT1 together, the plurality of first touch patterns PT1 and the plurality of second touch patterns PT2 may form a second touch electrode TP2. As such, the plurality of first touch patterns PT1 and the plurality of second touch patterns PT2 may form one second touch electrode TP2 by electrically connecting each other.

As seen in FIGS. 2, 3A, and 3B, the second connection part CP2 electrically connects adjacent second touch electrodes TP2 via contact holes CNT. Although not illustrated in a cross-sectional view, the second connection part CP2 is disposed on and at least partially overlaps with respective portions of adjacent first touch patterns PT1 of adjacent second touch electrodes TP2 via contact holes CNT. For example, the opposing sides of the second connection part CP2 may respectively overlap with two first touch patterns TP1 that are adjacent to one another in the first direction X, as is illustrated in FIG. 2. The respective sides of the second connection part CP2 may additionally and respectively overlap with two first dummy patterns DM1 that are adjacent to one another in the first direction X, as is also illustrated in FIG. 2. In this manner, the first dummy patterns DM1 may be respectively disposed between the two adjacent first touch patterns TP1 and the first connection part CP1.

When viewed in a plan view, the respective surface areas of the second connection parts CP2 may be greater than the respective surface areas of the first touch patterns PT1 and the second touch patterns PT2. It is contemplated, however, that, when viewed in a plan view, the respective surface areas of the second connection parts CP2 may be the same as the respective surface areas of the first touch patterns PT1 and the second touch patterns PT2. Further, the second connection part CP2 may have a rectangle shape; however, exemplary embodiments are not limited thereto. For instance, the second connection part CP2 may have one or more of the shapes described in association with the first and second touch patterns PT1 and PT2.

According to one or more exemplary embodiments, opposing sides of the second connection part CP2 may be integrally formed (or connected) with respective portions of whole or partially formed second touch patterns, such as partially formed second touch patterns PT2'. In this manner, the second signal line SL2 may include the second touch electrode TP2 including the plurality of first touch patterns PT1 and the plurality of second touch patterns PT2, and the second connection part CP2 electrically connecting adjacent second touch electrodes TP2.

First dummy part DM1 may be positioned between the first signal line SL1 and the second signal line SL2. That is, the first dummy part DM1 may be positioned between the first touch electrode TP1 and the second touch electrode TP2. Second dummy part DM2 may be positioned in the outermost regions of the first touch electrode TP1 and second touch electrode TP2. At least two of the first dummy parts DM1 may be positioned in the same layer as at least one of the first touch pattern PT1 and the second touch pattern PT2. The first and second dummy parts DM1 and DM2 positioned in the same layer as the second touch pattern PT2 may completely or partially overlap the first touch pattern PT1 included in the first touch electrode TP1 or the second touch electrode TP2. The first and second dummy parts DM1 and DM2 may be connected to the first touch pattern PT1; however, exemplary embodiments are not limited thereto.

According to one or more exemplary embodiments, the first and second dummy parts DM1 and DM2 positioned in the same layer as the second touch pattern PT2 have a smaller surface area than the second touch pattern PT2 included in the first touch electrode TP1 or the second touch electrode TP2; however, exemplary embodiments are not limited thereto. For instance, the first and second dummy parts DM1 and DM2 positioned in the same layer as the second touch pattern PT2 may have a surface area that is the same as or greater than the second touch pattern PT2 included in the first touch electrode TP1 or the second touch electrode TP2. The first and second dummy parts DM1 and DM2 positioned in the same layer as the first touch pattern PT1 may have a smaller surface area than the first touch pattern PT1 included in the first touch electrode TP1 or the second touch electrode TP2; however, exemplary embodiments are not limited thereto. For instance, and the first and second dummy parts DM1 and DM2 positioned in the same layer as the first touch pattern PT1 may have a surface area that is the same as or greater than the first touch pattern PT1 included in the first touch electrode TP1 or the second touch electrode TP2.

As described above, as the first signal line SL1 and the second signal line SL2 respectively include the plurality of first touch patterns PT1 and the plurality of second touch patterns PT2. In this manner, the touch sensor portion TS of the touch panel 100 includes the plurality of first touch patterns PT1 and the plurality of second touch patterns PT2.

According to one or more exemplary embodiments, as the touch sensor portion TS respectively includes the plurality of first touch patterns PT1 separated from each other and the plurality of second touch patterns PT2 separated from each other, and the plurality of second touch patterns PT2 respectively and partially overlap the plurality of first touch patterns PT1, since the densities of the plurality of first touch patterns PT1 and the plurality of second touch patterns PT2 included in the touch sensor portion TS are uniform throughout the touch sensor portion TS, the first touch electrode TP1, the first connection part CP1, the second touch electrode TP2, the second connection part CP2, and the first and second dummy parts DM1 and DM2 are suppressed (or reduced) from being recognized (e.g., seen) by an observer. Also, although the first touch pattern PT1 includes the silver nanowire having high reflectivity compared with other materials, since the density of the plurality of first touch patterns PT1 is uniform throughout the region of the touch sensor portion TS, the first touch electrode TP1, the first connection part CP1, the second touch electrode TP2, and the first and second dummy parts DM1 and DM2 are respectively suppressed (or reduced) from being recognized (e.g., seen) from the outside by an observer. That is, the touch panel 1000 in which the touch sensor portion TS including the first signal line SL1, the second signal line SL2, and the first and second dummy parts DM1 and DM2 is formed, is suppressed (or reduced) from being recognized (e.g., seen) by an observer.

Additionally, the plurality of first touch patterns PT1 and/or the plurality of second touch patterns PT2 respectively included in the first signal line SL1 and the second signal line SL2 include the silver nanowire having electrical conductivity, and the plurality of first touch patterns PT1 overlap and are electrically connected to the plurality of second touch patterns PT2, electrical resistance of the first signal line SL1 and the second signal line SL2 is decreased such that delay of signals respectively transmitted through the first signal line SL1 and the second signal line SL2 is suppressed (or at least reduced). That is, by suppressing (or reducing) the delay of the signal, a touch panel 1000 including the touch sensor portion TS with improved sensitivity for recognizing touch interaction is provided. Also, the touch sensor portion TS includes the plurality of first touch patterns PT1 separated from each other and the plurality of second touch patterns PT2 separated from each other such that the flexibility of the touch sensor portion TS is improved. To this end, the touch panel 1000 may be optimal as a flexible touch panel for a flexible display panel.

Further, according to one or more exemplary embodiments, as the touch sensor portion TS includes the plurality of first touch patterns PT1 separated from each other and the plurality of second touch patterns PT2 separated from each other, although the stress depending on the bending of the substrate SUB is generated in the touch sensor portion TS, since the stress is easily dispersed through the plurality of first touch patterns PT1 and the plurality of second touch patterns PT2, the touch sensor portion TS is suppressed from being damaged by the stress. That is, touch panel 1000 is provided in which damage due to applied stress is suppressed (or reduced).

Figure 4:
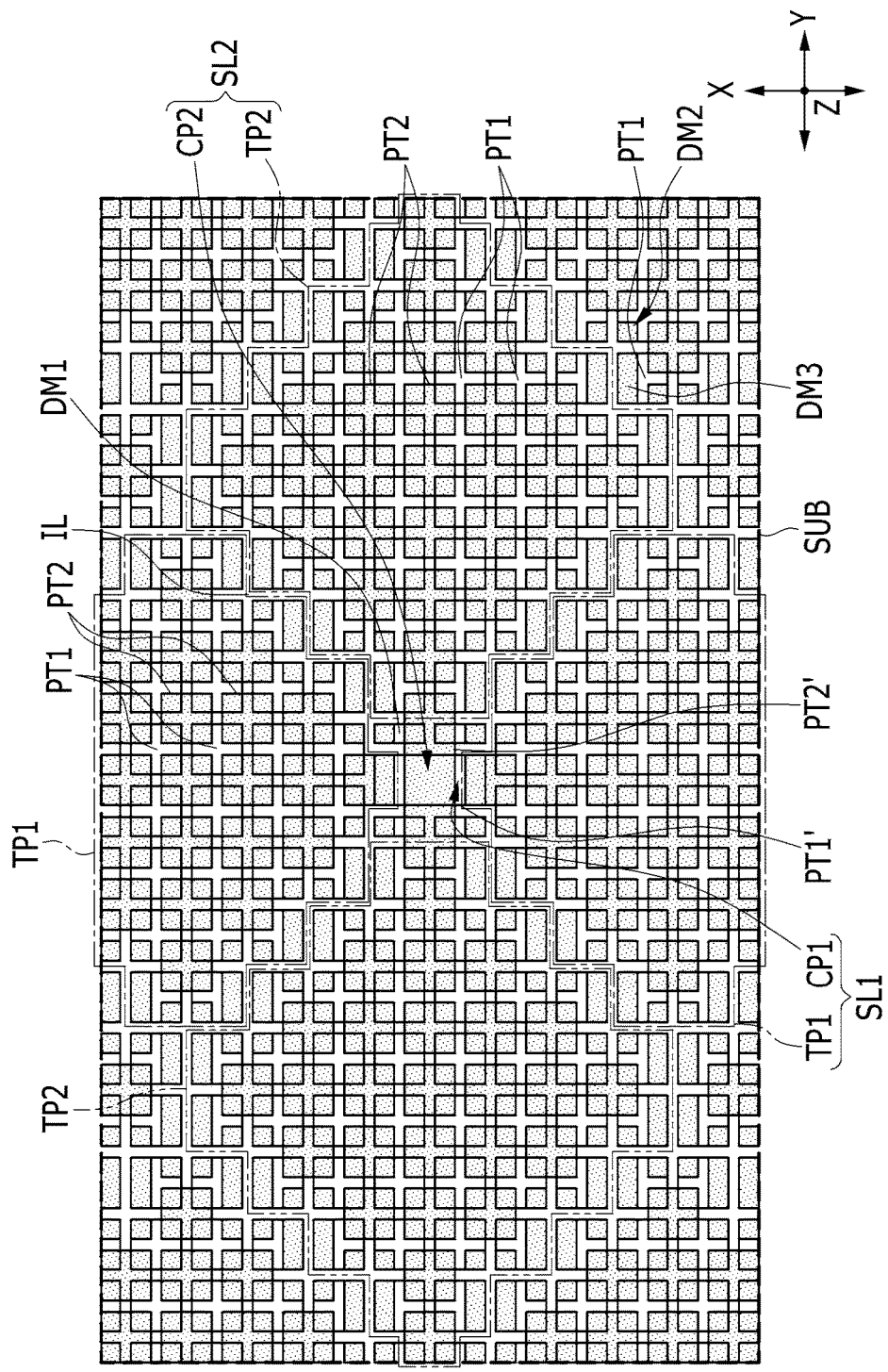
FIG. 4 is a plan view of a portion of a touch panel, according to one or more exemplary embodiments.

FIG. 4 is a plan view of a portion of a touch panel, according to one or more exemplary embodiments. The touch panel of FIG. 4 is similar to the touch panel of FIG. 1, and, as such, duplicative descriptions are omitted to avoid obscuring exemplary embodiments described herein.

As shown in FIG. 4, the touch sensor portion TS of the touch panel includes the first signal line SL1, the insulating layer IL, the second signal line SL2, and first, second, and third dummy parts DM1, DM2, and DM3.

First dummy part DM1 may be positioned between the first signal line SL1 and the second signal line SL2. For instance, the first dummy part DM1 may be disposed between the first touch electrode TP1 and the second touch electrode TP2. The second and third dummy parts DM2 and DM3 may be positioned in the outermost regions of the first touch electrode TP1 and second touch electrode TP2. The first, second, and third dummy parts DM1, DM2, DM3 are positioned in the same layer as at least one of the first touch pattern PT1 and the second touch pattern PT2. The first, second, and third dummy parts DM1, DM2, and DM3 positioned in the same layer as the second touch pattern PT2 may overlap the first touch pattern PT1. The first, second, and third dummy parts DM1, DM2, and DM3 may or may not be connected to the first touch pattern PT1. The first, second, and third dummy parts DM1, DM2, and DM3 positioned in the same layer as the first touch pattern PT1 or the second touch pattern PT2 has a smaller surface area than the first touch pattern PT1 or the second touch pattern PT2 included in the first touch electrode TP1 or the second touch electrode TP2; however, exemplary embodiments are not limited thereto. For instance, at least one of the first, second, and third dummy parts DM1, DM2, and DM3 may have a surface area that is the same as or larger than the surface area of the first touch pattern PT1 or the second touch pattern PT2 included in the first touch electrode TP1 or the second touch electrode TP2.

The first, second, and third dummy parts DM1, DM2, and DM3 positioned in the same layer as the second touch pattern PT2 is plural, and the plurality of first, second, and third dummy parts DM1, DM2, and DM3 may have different surface areas from each other. For example, the surface area of the third dummy part DM3 may be larger than the surface area of the first and second dummy parts DM1 and DM2 positioned in the same layer as the second touch pattern PT2. The first and second dummy parts DM1 and DM2 may have the same surface area as one another.

Accordingly, the first signal line SL1 and the second signal line SL2 respectively include the plurality of first touch patterns PT1 and the plurality of second touch patterns PT2, as s well as the first, second, and third dummy parts DM1, DM2, and DM3 that are positioned in the same layer as the first touch pattern PT1 and the second touch pattern PT2. In this manner, the touch sensor portion TS included in the touch panel may include the plurality of first touch patterns PT1 and the plurality of second touch patterns PT2. As the touch sensor portion TS includes the plurality of first touch patterns PT1 separated from each other, the plurality of second touch patterns PT2 separated from each other, and the plurality of second touch patterns PT2 respectively overlap at least part of the plurality of first touch patterns PT1, and since the densities of the plurality of first touch patterns PT1 and the plurality of second touch patterns PT2 are uniform throughout the region of the touch sensor portion TS, the first touch electrode TP1, the first connection part CP1, the second touch electrode TP2, the second connection part CP2, and the first, second, and third dummy parts DM1, DM2, and DM3 are respectively suppressed (or reduced) from being recognized or otherwise seen by an observer.

Figure 5:
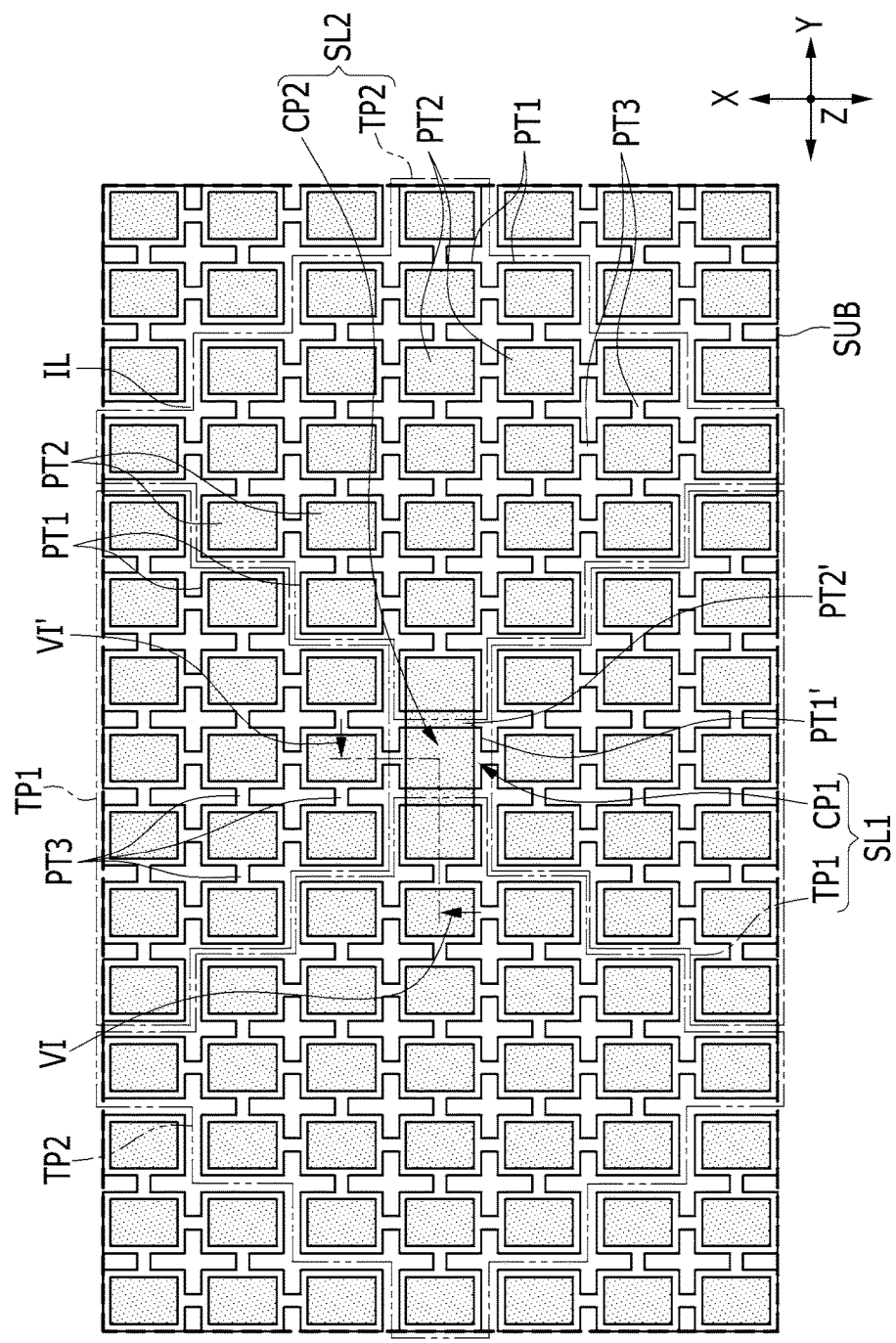
FIG. 5 is a plan view of a portion of a touch panel, according to one or more exemplary embodiments.
Figure 6:
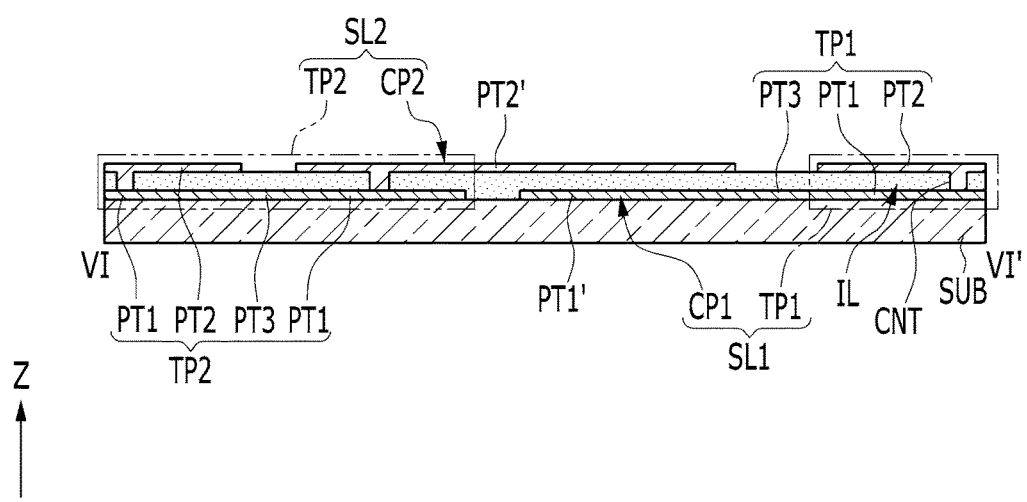
FIG. 6 is a cross-sectional view of the touch panel of FIG. 5 taken along sectional line VI-VI', according to one or more exemplary embodiments.

FIG. 5 is a plan view of a touch panel, according to one or more exemplary embodiments. FIG. 6 is cross-sectional view of the touch panel of FIG. 5 taken along sectional line VI-VI', according to one or more exemplary embodiments. The touch panel of FIGS. 5 and 6 is similar to the touch panels of FIGS. 1, 2, 3A, 3B, and 4, and, as such, duplicative descriptions are omitted to avoid obscuring exemplary embodiments described herein.

As shown in FIGS. 5 and 6, the touch sensor portion TS of the touch panel may include the first signal line SL1, the insulating layer IL, and the second signal line SL2.

The first signal line SL1 includes the first touch electrode TP1 and the first connection part CP1. The first touch electrode TP1 includes a plurality of the first touch patterns PT1, a plurality of the second touch patterns PT2, and a plurality of the connection patterns PT3. The plurality of connection patterns PT3 respectively connect between adjacent first touch patterns PT1 of the plurality of first touch patterns PT1. The plurality of connection patterns PT3 are integrally formed with the plurality of first touch patterns PT1. In one or more exemplary embodiments, the connection pattern PT3 has a smaller surface area than the surface area of the first touch pattern PT1. The connection pattern PT3 includes silver nanowire (AgNW). For example, the third touch pattern PT3 may include a resin layer made of a resin and the silver nanowire dispersed in the resin layer. It is contemplated, however, that the third touch pattern PT3 may include a metal mesh and/or a transparent conductive material, AZO, GZO, ITO, IZO, ZnO, $In_2O_3$, etc. It is also contemplated that one or more conductive polymers (ICP) may be utilized, such as, polyaniline, PEDOT:PSS, etc.

A plurality of second touch patterns PT2 are positioned on a plurality of first touch patterns PT1. The plurality of second touch patterns PT2 are respectively separated from each other. The plurality of second touch patterns PT2 are arranged in the matrix formation; however, exemplary embodiments are not limited thereto. For instance, the plurality of second touch patterns PT2 may be separated from each other in one or more of the aforementioned various shapes, such as the irregular shape. Further, the plurality of second touch patterns PT2 may respectively have the same surface area or different surface areas from one another.

According to one or more exemplary embodiments, the plurality of second touch patterns PT2 may completely overlap the plurality of first touch patterns PT1 corresponding thereto. The second touch pattern PT2 may have a quadrangle shape; however, exemplary embodiments are not limited thereto. For instance, the second touch pattern PT2 may have a polygon shape, such as a triangle shape, a pentagon shape, a hexagon shape, a heptagon shape, a octagon shape, or a nonagon shape, or the various shapes, such as a circle shape, an ellipse shape, or the closed-loop shape.

The second touch pattern PT2 is connected to the first touch pattern PT1 through the contact hole CNT formed in the insulating layer IL positioned between the first touch pattern PT1 and the second touch pattern PT2. The second touch pattern PT2 has a smaller surface area than the surface area of the first touch pattern PT1; however, exemplary embodiments are not limited thereto. For instance, the second touch pattern PT2 may have a larger surface area than the surface area of the first touch pattern PT1. Also, the second touch pattern PT2 includes a different material from that of the first touch pattern PT1. For example, the second touch pattern PT2 may include at least one of the aforementioned transparent conductive materials. It is also contemplated that the second touch pattern PT2 may include the transparent conductive material, such as silver nanowire (AgNW) or the metal mesh.

Accordingly, the plurality of first touch patterns PT1 disposed in the matrix formation to be separated from each other and respectively connected by the connection pattern PT3, and the plurality of second touch patterns PT2 completely and respectively overlapping the plurality of first touch patterns PT1 and disposed in the matrix formation to be separated from each other may form a first touch electrode TP1 having determined region.

The first connection part CP1 connects the adjacent first touch electrodes TP1. The first connection part CP1 includes at least one first touch pattern PT1', and the first touch pattern PT1' is electrically connected to the first touch pattern PT1 positioned outermost among the plurality of first touch patterns PT1 included in the first touch electrode TP1 through the connection pattern PT3. The first touch pattern PT1' included in the first connection part CP1 may have the same surface area as the first touch pattern PT1 included in the first touch electrode TP1. In one or more exemplary embodiments, the first touch pattern PT1' included in the first connection part CP1 may have a surface area that is greater than or smaller than the surface area of the first touch pattern PT1 included in the first touch electrode TP1.

Further, the first connection part CP1 may include one first touch pattern PT1'; however, exemplary embodiments are not limited thereto. For instance, the first connection part CP1 may include a plurality of first touch patterns PT1'.

As described above, the first signal line SL1 may include the first touch electrode TP1 including the plurality of first touch patterns PT1, the plurality of second touch patterns PT2, and the plurality of connection patterns PT3, and the first connection part CP1. The first connection part CP1 electrically connects between the adjacent first touch electrodes TP1.

The second signal line SL2 includes the second touch electrode TP2 and the second connection part CP2. The second touch electrode TP2 includes the plurality of first touch patterns PT1, the plurality of second touch patterns PT2, and the plurality of connection patterns PT3. The plurality of connection patterns PT3 respectively connect between the plurality of first touch patterns PT1. The plurality of connection patterns PT3 are integrally formed with the plurality of first touch patterns PT1. The connection pattern PT3 may have a smaller surface area than the surface are of the first touch pattern PT1.

The plurality of second touch patterns PT2 are positioned on the plurality of first touch patterns PT1. The plurality of second touch patterns PT2 are respectively separated from each other. The plurality of second touch patterns PT2 are arranged in a matrix formation; however, exemplary embodiments are not limited thereto. For instance, the second touch patterns PT2 may be separated from each other in one or more of the aforementioned various shapes. The plurality of second touch patterns PT2 may have the same surface area or different surface areas from each other. Further, the plurality of second touch patterns PT2 may completely overlap the plurality of first touch patterns PT1 corresponding thereto.

According to one or more exemplary embodiments, the second touch pattern PT2 may have a quadrangle shape; however, exemplary embodiments are not limited thereto. For instance, the second touch pattern PT2 may have one or more of the polygon shapes or the various shapes. The second touch pattern PT2 is positioned on the first touch pattern PT1, and the second touch pattern PT2 is connected to the first touch pattern PT1 through the contact hole CNT formed in the insulating layer IL positioned between the first touch pattern PT1 and the second touch pattern PT2. The second touch pattern PT2 has a smaller surface area than the surface area of the first touch pattern PT1; however, exemplary embodiments are not limited thereto. For example, the second touch pattern PT may have a larger surface area than the surface area of the first touch pattern PT1.

Accordingly, the plurality of first touch patterns PT1 disposed in the matrix formation to be separated from each other and respectively connected by the connection pattern PT3, and the plurality of second touch patterns PT2 completely and respectively overlapping the plurality of first touch patterns PT1 and disposed in the matrix formation to be separated from each other may form one second touch electrode TP2 having a predetermined region.

The second connection part CP2 connects the adjacent second touch electrodes TP2. The second connection part CP2 includes at least one second touch pattern PT2', and the second touch pattern PT2' is integrally connected with the second touch pattern PT2 positioned outermost among the plurality of second touch patterns PT2 included in the second touch electrode TP2. In addition, each of the second touch patterns PT2 positioned outermost of the second touch electrode TP2 is electrically connected to each of the first touch patterns TP1 corresponding thereto. The second touch pattern PT2' included in the second connection part CP2 may have a larger surface area than the surface area of the second touch pattern PT2 included in the second touch electrode TP2. In one or more exemplary embodiments, the second touch pattern PT2' included in the second connection part CP2 may have a smaller surface area than the surface area of the second touch pattern PT2 included in the second touch electrode TP2. It is also contemplated that the second connection part CP2 may include one second touch pattern PT2'; however, exemplary embodiments are not limited thereto. For instance, the second connection part CP2 may include a plurality of second touch patterns PT2'.

As described above, the second signal line SL2 may include the second touch electrode TP2 including the plurality of first touch patterns PT1, the plurality of second touch patterns PT2, and the plurality of connection patterns PT3, and the second connection part CP2. The second connection part CP2 electrically connects between the adjacent second touch electrodes TP2.

According to one or more exemplary embodiments, given that the first signal line SL1 and the second signal line SL2 include the plurality of first touch patterns PT1, the plurality of second touch patterns PT2, and the plurality of connection patterns PT3, the touch sensor portion TS of the touch panel includes the plurality of first touch patterns PT1, the plurality of second touch patterns PT2, and the plurality of connection patterns PT3. As the touch sensor portion TS includes the plurality of first touch patterns PT1 separated from each other and the plurality of second touch patterns PT2 separated from each other, and the plurality of second touch patterns PT2 respectively and completely overlap the plurality of first touch patterns PT1, and since the densities of the plurality of first touch patterns PT1 and the plurality of second touch patterns PT2 are uniform throughout the region of the touch sensor portion TS, the first touch electrode TP1, the first connection part CP1, the second touch electrode TP2, the second connection part CP2, and the third connection part CP3 included in the touch sensor portion TS are suppressed (or at least reduced) from being recognized (or seen) by an observer.

Also, although the first touch pattern PT1 includes the silver nanowire having higher reflectivity than the other materials, since the density of the plurality of first touch patterns PT1 is uniform throughout the region of the touch sensor portion TS, and, simultaneously, the plurality of second touch patterns PT2 are completely overlapped on the plurality of first touch patterns PT1, the first touch electrode TP1, the first connection part CP1, the second touch electrode TP2, and the second connection part CP2, and the third connection part CP3 are respectively suppressed (or at least reduced) from being recognized by an observer. That is, the touch panel of which the touch sensor portion TS including the first signal line SL1 and the second signal line SL2 is suppressed from being recognized.

According to one or more exemplary embodiments, since the plurality of first touch patterns PT1 respectively included in the first signal line SL1 and the second signal line SL2 include the silver nanowire having a high electrical conductivity, and the plurality of first touch patterns PT1 completely overlap the plurality of second touch patterns PT2, each electrical resistance of the first signal line SL1 and the second signal line SL2 is decreased such that the delay of signals transmitted through the first signal line SL1 and the second signal line SL2 is suppressed (or at least reduced). That is, by suppressing (or reducing) the delay of the signal, the touch panel including the touch sensor portion TS with improved sensitivity for recognizing a touch interaction is provided.

According to one or more exemplary embodiments, the touch sensor portion TS includes the plurality of first touch patterns PT1 separated from each other and the plurality of second touch patterns PT2 separated from each other such that the flexibility of the touch sensor portion TS is improved. In this manner, the flexible touch panel nay be provided in association with a flexible display panel.

According to one or more exemplary embodiments, as the touch sensor portion TS includes the plurality of first touch patterns PT1 separated from each other and the plurality of second touch patterns PT2 separated from each other, although the stress depending on the bending of the substrate SUB is generated, since the stress is easily dispersed through the plurality of first touch patterns PT1 and the plurality of second touch patterns PT2, the touch sensor portion TS is suppressed (or reduced) from being damaged by the stress. That is, the touch panel in which damage due to the stress is suppressed (or reduced) is provided.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A touch panel comprising:
   first touch patterns disposed on a substrate, the first touch patterns being spaced apart from and electrically connected to one another; and
   second touch patterns partially overlapping the first touch patterns, the second touch patterns being spaced apart from and electrically connected to one another,
   wherein a first touch pattern of the first touch patterns is disposed adjacent to different first touch patterns of the first touch patterns in at least two different axis directions.

2. The touch panel of claim 1, wherein respective second touch patterns are disposed between adjacent first touch patterns of the first touch patterns.

3. The touch panel of claim 2, wherein the respective second touch patterns are electrically connected to the adjacent first touch patterns of the first touch patterns.

4. The touch panel of claim 3, further comprising:
   an insulating layer disposed between the first touch patterns and the second touch patterns,
   wherein the respective second touch patterns are electrically connected to the adjacent first touch patterns through contact holes formed in the insulating layer.

5. The touch panel of claim 3, wherein a second touch pattern of the second touch patterns partially overlaps with four adjacent first touch patterns of the first touch patterns.

6. The touch panel of claim 1, further comprising:
   a connection pattern connecting adjacent first touch patterns of the first touch patterns,
   wherein each of the second touch patterns completely overlaps with a corresponding first touch pattern of the first touch patterns.

7. The touch panel of claim 6, wherein the connection pattern is integrally formed with at least one first touch pattern of the first touch patterns.

8. The touch panel of claim 6, wherein the second touch pattern is electrically connected to the first touch pattern.

9. The touch panel of claim 8, further comprising:
   an insulating layer disposed between the first touch patterns and the second touch patterns,
   wherein the second touch pattern is electrically coupled to the first touch pattern through a contact hole formed in the insulating layer.

10. The touch panel of claim 1, wherein the first touch patterns comprise a different material from a material of the second touch patterns.

11. The touch panel of claim 10, wherein:
    the first touch patterns comprise silver nanowire; and
    the second touch patterns comprise a transparent conductive material.

12. The touch panel of claim 1, further comprising:
    a first signal line disposed on the substrate and extending in a first direction; and
    a second signal line disposed on the substrate and extending in a second direction crossing the first direction, the second signal line being disposed in a same layer as the first signal line,
    wherein the first signal line comprises a first plurality of the first touch patterns and a first plurality of the second touch patterns, the first plurality of the first touch patterns and the first plurality of the second touch patterns defining a first touch electrode,
    wherein the second signal line comprises a second plurality of the first touch patterns and a second plurality of the second touch patterns, the second plurality of the first touch patterns and the second plurality of the second touch patterns defining a second touch electrode,
    wherein the first plurality of the first touch patterns is mutually exclusive of the second plurality of the first touch patterns, and
    wherein the first plurality of the second touch patterns is mutually exclusive of the second plurality of the second touch patterns.

13. The touch panel of claim 12, wherein the first signal line comprises:
    a third touch electrode; and
    a first connection part electrically connecting the first touch electrode and the third touch electrode to one another, the first connection part extending in the first direction.

14. The touch panel of claim 13, wherein the first connection part is integrally connected with at least one partially formed first touch pattern of the first touch patterns.

15. The touch panel of claim 13, wherein:
    the second signal line comprises:
      a fourth touch electrode; and
      a second connection part disposed on and insulated from the first connection part, the second connection part extending in the second direction; and
    the second connection part electrically connects the second touch electrode and the fourth touch electrode to one another.

16. The touch panel of claim 15, wherein the second connection part is integrally connected with at least one second touch pattern of the second touch patterns.

17. The touch panel of claim 15, further comprising:
    a dummy part disposed on the substrate in the same layer,
    wherein the dummy part is disposed between the first touch electrode and the second touch electrode.

18. The touch panel of claim 17, wherein, in a plan view, a surface area of the dummy part is different than surface areas of at least one of the first touch patterns and the second touch patterns.

19. A touch panel comprising:
a first signal line extending in a first direction on a substrate, the first signal line comprising:
a first touch electrode;
a second touch electrode; and
a first connection part electrically connecting the first touch electrode and the second touch electrode to one another; and
a second signal line extending in a second direction on the substrate, the second signal line comprising:
a third touch electrode;
a fourth touch electrode; and
a second connection part electrically connecting the third touch electrode and the fourth touch electrode to one another,
wherein each of the first touch electrode, the second touch electrode, the third touch electrode, and the fourth touch electrode respectively comprises:
first touch patterns spaced apart from one another; and
second touch patterns spaced apart from one another and at least partially overlapping with corresponding first touch patterns of the first touch patterns, and
wherein the first touch patterns are electrically connected to the second touch patterns.

20. A touch panel comprising:
a first signal line extending in a first direction on a substrate, the first signal line comprising:
first touch electrodes; and
a first connection part electrically connecting the first touch electrodes to one another; and
a second signal line extending in a second direction on the substrate, the second signal lines comprising:
second touch electrodes; and
a second connection part electrically connecting the second touch electrodes to one another,
wherein each of the first touch electrodes and the second touch electrodes respectively comprises:
first touch patterns separated from each other;
a connection pattern connecting the first touch patterns to one another; and
second touch patterns completely overlapping with a corresponding first touch pattern of the first touch patterns, and
wherein the first touch patterns are electrically connected to the second touch patterns.

* * * * *